(12) United States Patent
Liu

(10) Patent No.: US 8,742,763 B2
(45) Date of Patent: Jun. 3, 2014

(54) BATTERY MODULE STATE DETECTION METHOD

(75) Inventor: Chin-Chuan Liu, Niaosong Township, Kaohsiung County (TW)

(73) Assignee: Chung-Shan Institute of Science and Technology, Armaments Bureau, Ministry of National Defense, Taoyuan County (TW)

( * ) Notice: Subject to any disclaimer, the term of this patent is extended or adjusted under 35 U.S.C. 154(b) by 639 days.

(21) Appl. No.: 12/749,327

(22) Filed: Mar. 29, 2010

(65) Prior Publication Data

US 2011/0234166 A1 Sep. 29, 2011

(51) Int. Cl.
*G01N 27/416* (2006.01)
*H02J 7/00* (2006.01)

(52) U.S. Cl.
USPC ............ 324/430; 324/427; 320/132; 320/134

(58) Field of Classification Search
USPC .......................................... 320/132; 324/430
See application file for complete search history.

(56) References Cited

U.S. PATENT DOCUMENTS

| | | | |
|---|---|---|---|
| 2009/0112496 A1* | 4/2009 | Suzuki | 702/63 |
| 2009/0224771 A1* | 9/2009 | Deveau et al. | 324/600 |
| 2010/0001693 A1* | 1/2010 | Iida et al. | 320/134 |

FOREIGN PATENT DOCUMENTS

JP 1193675 * 1/1989

* cited by examiner

*Primary Examiner* — Edward Tso
*Assistant Examiner* — Johali Torres Ruiz

(57) ABSTRACT

The present invention provides a battery module state detection method. The battery module includes a battery unit and is connected to a load. The method for detecting the battery module status includes the following steps. First, measure an on-load voltage value of the battery unit and a load current value of a load. Next, calculate an instant resistance value of the battery unit according to a no-load voltage value of the battery unit, the on-load voltage value and the load current value. Finally, obtain an operating state of the battery unit according to the instant resistance and a relationship between the internal resistance and discharging time. By the method of the present invention, the user can monitor the remaining energy of the battery module accurately in real time and therefore prevent the electrical hazard caused by over-discharging the battery module.

5 Claims, 4 Drawing Sheets

BATTERY MODULE STATE DETECTION METHOD

BACKGROUND OF THE INVENTION

1. Field of the Invention

The present invention generally relates to battery module state detection method, and more particularly, to a detection method of measuring the internal resistance of the battery unit of the battery module during the regular discharging operation thereof as an index of the lifetime and quality of the battery module.

2. Description of the Prior Art

Generally, a real battery should have its own internal resistance comparing to an ideal battery. The internal resistance of the battery is determined by the internal factors such as the ion concentration in the electrolyte, as well as the area, density and material of the electrode plate. During the discharging process of the battery, the abovementioned internal factors will undergo changes in a forward direction and therefore result in the increasing internal resistance of the battery. When the battery is in the recharging process, the abovementioned internal factors will undergo changes in a reverse direction and result in a decreasing internal resistance of the battery. Therefore, there exists a positive correlation between the remaining energy and the internal resistance of the battery during the lifetime of a properly functioning battery. For example, if the internal resistance of the battery during the discharging processes increases to 1.24 times the internal resistance of the battery which is being fully recharged for the first time, it is indicated that the battery only has half of its full capacity left. The multiplier may vary according to the types of the batteries, but it should be almost the same value for batteries of the same type.

In practical application, however, with each time the battery is discharged or recharged, the ion concentration of the electrolyte and the area, density and material of the electrode plate will gradually degenerate and can't be recovered whether the process is in the forward or reverse direction. This situation reflects the fact that those inner factors can never be restored to their best state ever since the battery has been manufactured even if the battery is been recharged. As a result, the internal resistance will increase in proportion to the increasing times of the discharging and recharging process even if the battery is fully recharged in each recharging process. For example, when the internal resistance value of a recharged battery has increased to two times the internal resistance value of the battery after recharged for the first time, it is indicated that the battery should not be used anymore.

Since the internal resistance of the battery has characteristics of the variation mentioned hereinabove, the current remaining energy and residual lifetime of the battery can be predicted within its life cycle if there is a method for monitoring the internal resistance of the battery in real time. On the other hand, the internal resistance of the battery will increase rapidly near the end of the discharging cycle, which will induce a rapid rise of internal temperature.

Taking a battery module composed of a plurality of battery units into consideration. If a battery unit of the battery module comes to its end of the discharging cycle in advance while other battery units still work properly, it would be very difficult to point out such irregular operating condition from the operating state presented by the whole battery module. If the change of the internal resistance of respective battery units can be monitored in real time, then the abnormal battery unit can be detected in real time. In such a way, the position where electrical fire may occur in the battery module can be predicted and treated immediately to prevent the fire hazard.

To carry out the measuring of the internal resistance of a battery with the conventional method, an external high frequency alternating current signal has to be applied on the battery while the direct current has to be isolated by a capacitor. In addition, an AC meter is used to measure the voltage division of each battery and the total alternative voltage, which will then be used to calculate the internal resistance of the specific battery unit with reference to the internal resistance of the battery unit measured in advance. The shortcoming of this method is that the operating process and assembly of the equipment will be very complicated. For an electrical vehicle in service or other equipment in motion, it is nearly impossible to apply the aforementioned method to monitor the internal resistance of each of the battery units of the battery module in real time. What's more, dangerous situations may occur if the method is applied.

For example, the applied external alternating current will recharge the battery unit at a positive half-cycle and discharge the battery unit at a negative half-cycle. Therefore, if the detector device is connected on both side of the battery unit for a long period, it will cause great damage to the battery unit due to recharging and discharging the battery unit alternately with a high frequency, and meanwhile cause electric interference to the load equipment.

SUMMARY OF THE INVENTION

The objective of the present invention is to provide a battery module state detection method for a battery module to solve the problems in the prior art.

According to one embodiment of the present invention, the battery module comprises a battery unit and is electrically connected to a load. The battery module state detection method comprises the following steps: (1) measuring an on-load voltage value of the battery unit and a load current value of the load; (2) calculating an instant internal resistance value of the battery unit according to a no-load voltage value of the battery unit, the on-load voltage value and the load current; (3) obtaining an operating state of the battery unit according to the instant internal resistance value and a relationship between internal resistance and discharging time.

In conclusion, the operating state of a battery unit, such as the current remaining energy value and lifetime, can be determined according to the variation of the internal resistance measured by the method based on the present invention. Because no external high frequency alternating current is needed to apply on the battery with the method, there is no need of complex equipment. Therefore, the method not only simplifies the design of the battery module and the wiring thereof, but also prevents the decreasing of the battery lifetime due to swift alternating recharge and discharge by the high frequency alternating current. Furthermore, the application of the method will not interfere with the power supplying function of the battery and circuit thereof, the method can be applied to monitor the operating state of the battery in real time during the service of the battery, which can improve the convenience and safety of the battery.

BRIEF DESCRIPTION OF THE APPENDED DRAWINGS

DETAILED DESCRIPTION OF THE INVENTION

The present invention provides a battery module state detection method for monitoring the internal resistance of each battery unit in the battery module so that the current remaining energy value and lifetime of the battery unit can be determined. Furthermore, the position that might cause fire hazard in the battery module can be predicted as well. The embodiments of the present invention will be described in the following detailed description.

Figure 1:
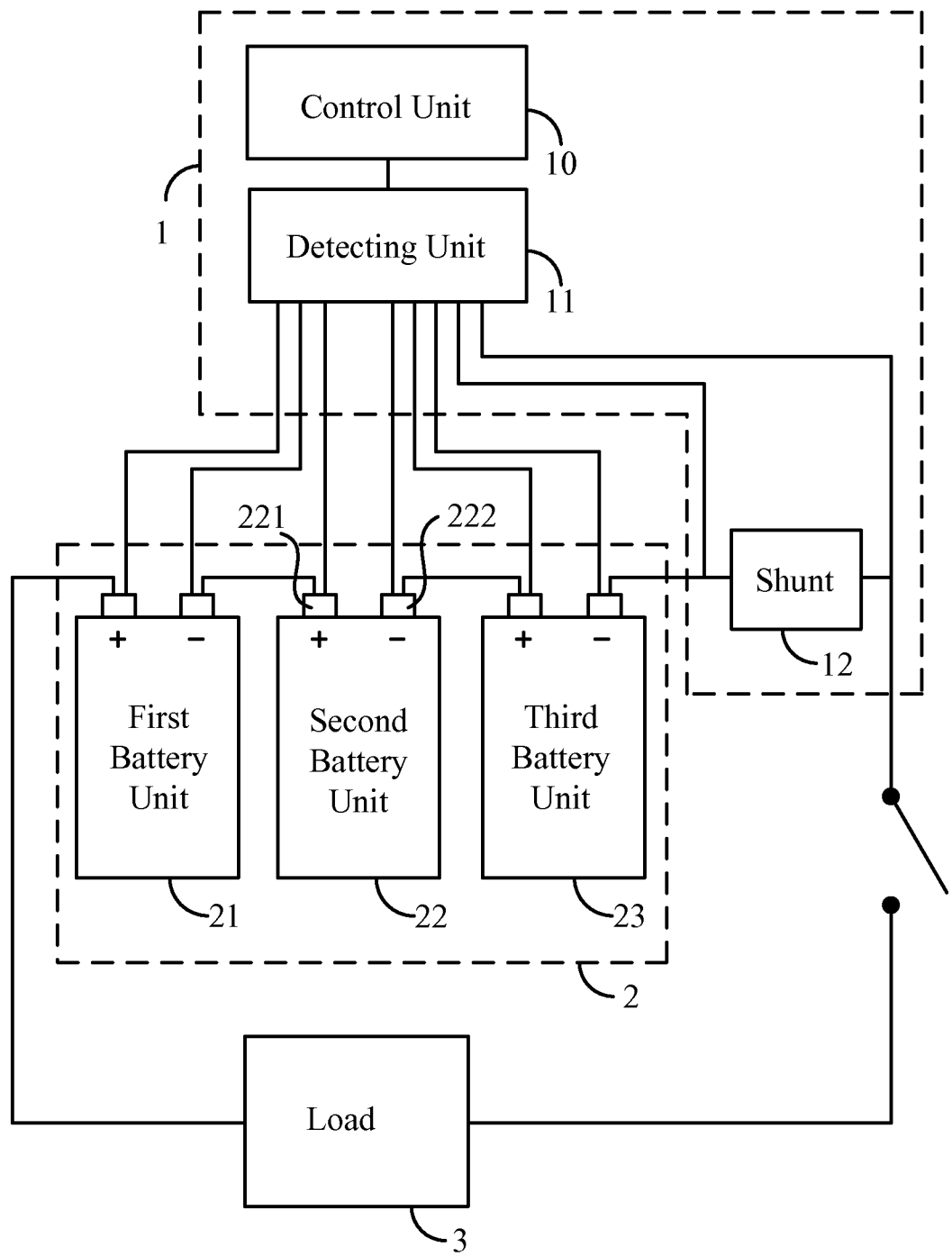
FIG. 1 is a schematic view of the battery module state detection device according to one embodiment of the present invention.
Figure 2:
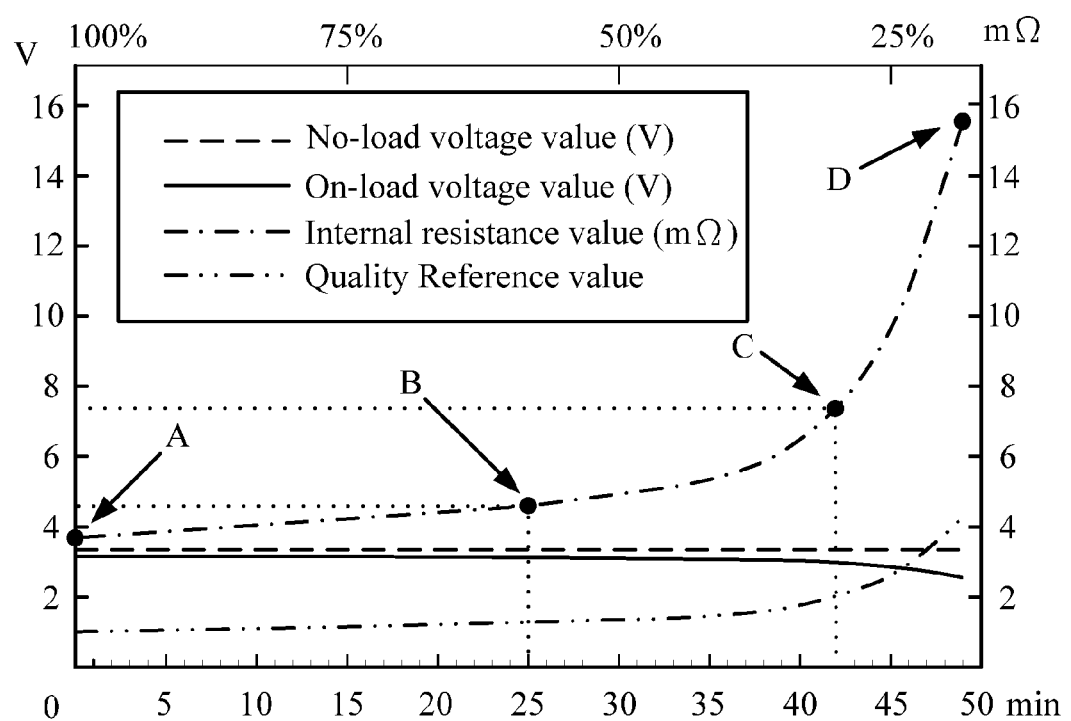
FIG. 2 is a diagram showing the relationship between the voltage and internal resistance verses the discharging time of a battery unit according to one embodiment of the present invention.
Figure 3:
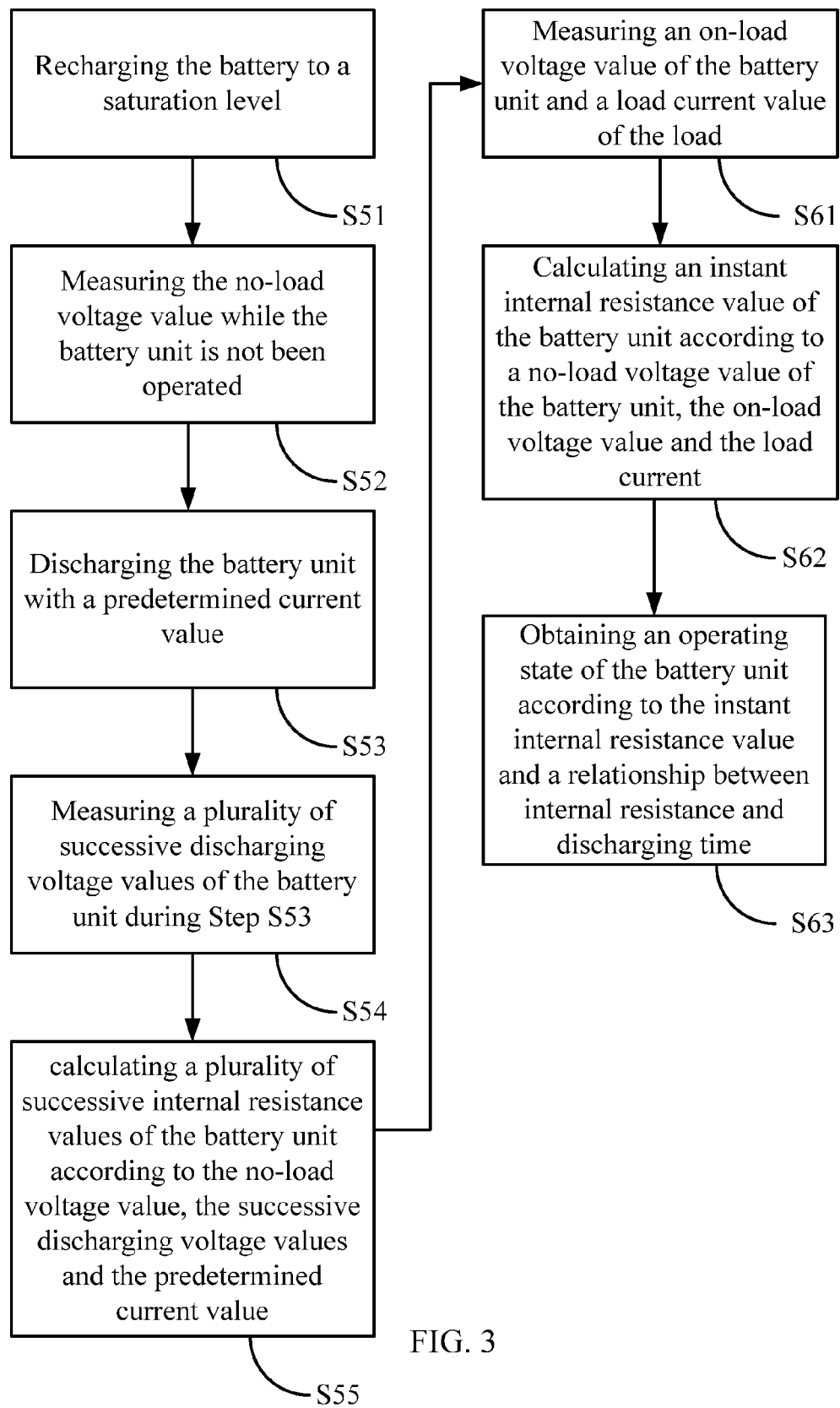
FIG. 3 is a flow chart of the battery module state detection method according to one embodiment of the present invention.
Figure 4:
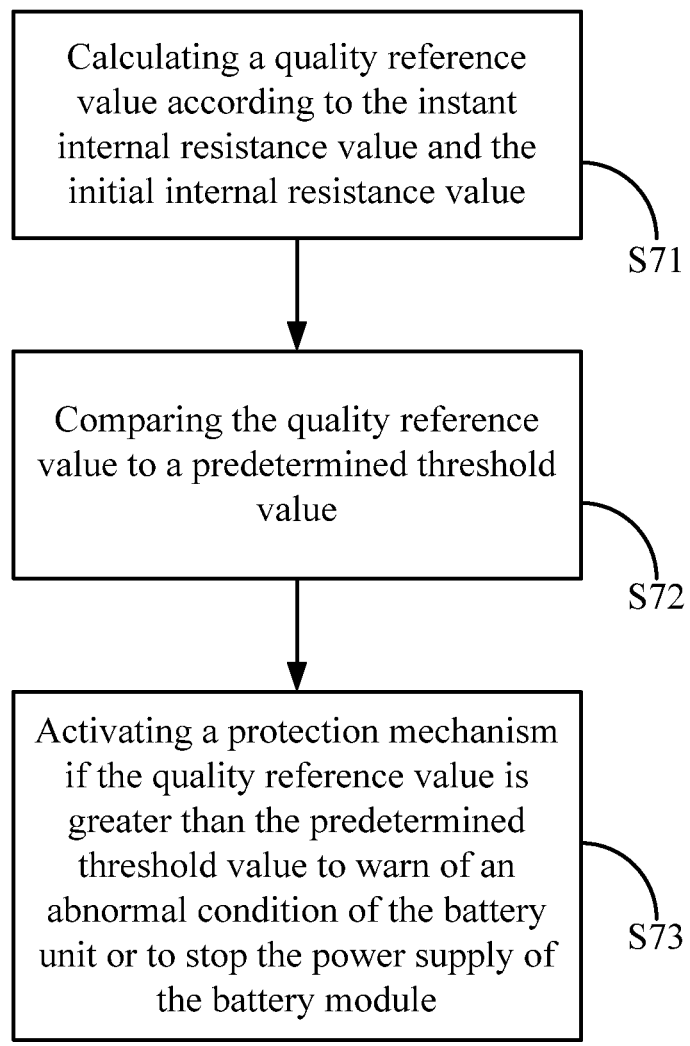
FIG. 4 is a flow chart of the activation of the protection mechanism according to one embodiment of the present invention.

FIG. 1 is a schematic view of the battery module state detection device 1 according to one embodiment of the present invention. FIG. 2 is a diagram showing the relationship between the voltage and internal resistance verses the discharging time of a battery unit according to one embodiment of the present invention. FIG. 3 is a flow chart of the battery module state detection method according to one embodiment of the present invention. FIG. 4 is a flow chart of the activation of the protection mechanism according to one embodiment of the present invention.

Referring to FIG. 1, the battery module state detection device 1 for detecting the battery module 2 according to one embodiment of the present invention is illustrated therein. The battery module state detection device 1 comprises the control unit 10, the detecting unit 11 and the shunt 12. The battery module 2 comprises the first battery unit 21, the second battery unit 22 and the third battery unit 23, which are all connected in series with each other and comprise a positive electrode and negative electrode respectively. The shunt 12 is in serial connected between the battery module 2 and the load 3 and is used to detect a load current value, which flows through the load 3, in cooperation with the detecting unit 11. The detecting unit 11 comprises a plurality of testing terminals, which are connected to the positive electrode and negative electrode of each battery unit respectively and are configured for the measuring of output voltage values of each of the battery units. It should be mentioned that the battery module 2 may comprise different amount of the battery units, which can be connected in series or parallel in the circuit with different configuration and will not interfere the function for the battery module state detection device 1 to detect the internal resistance and remaining energy value of each battery units.

Method of detecting the internal resistance of each of the battery units will be explained hereinafter by considering the second battery unit 22 as an example. The second battery unit 22 comprises the second positive electrode 221 and the second negative electrode 222. Besides being connected to the neighboring negative electrode of the first battery unit 21 and the positive electrode of the third battery unit 23 respectively, the second positive electrode 221 and the second negative electrode 222 are further connected to the detecting unit 11. With this configuration, the detecting unit 11 can measure the no-load voltage value of the second battery unit 22 when disconnecting the battery module 2 from the power supply circuit. Furthermore, the detecting unit 11 can measure the on-load voltage value of the second battery unit 22 when the battery module 2 supplies power to the load 3. The control unit 10 will then calculate the internal resistance value of the second battery unit 22 according to the no-load voltage value and on-load voltage value of the second battery unit 22 and the load current value. More specifically, the internal resistance value of the second battery unit 22 ($V_{22}$)=(the no-load voltage value−the on-load voltage value)÷load current value.

To estimate the current remaining energy value and the remaining lifetime of the second battery unit 22 by measuring the internal resistance of the second battery unit 22, a reference standard should be established. Therefore, the discharging data of the second battery unit 22 need to be measured and recorded during the first discharging cycle of the second battery unit 22 right after it has been manufactured and recharged.

Please refer to FIG. 2, which shows the discharging data of the second battery unit 22 which is discharging for the first time after being manufactured. In the present embodiment, the second battery unit 22 is a lithium iron phosphate battery unit with the capacity of 50 Ah capacity and voltage of 3.34 V. In FIG. 2, the plotted data is acquired under the 1 C discharge rate of the second battery unit 22, that is, a constant discharging current of 50 ampere in this case. In such a case, the second battery unit 22 should run out of energy after being discharged for 60 minutes. Therefore, the scale on the transverse axis also corresponds to the ratio of the remaining energy value of the second battery unit 22 from another point of view.

The dotted horizontal line in FIG. 2 presents the no-load voltage value of the second battery unit 22, which is a constant value. The solid curved line in FIG. 2 presents the on-load voltage value of the second battery unit 22 during the discharging process of a constant discharging current, which will fall with the increasing discharging time. The single-dot chain line in FIG. 2, which presents the relationship between the internal resistance and discharging time of the second battery unit 22, can be acquired according to the no-load voltage value minus the on-load voltage value of the second battery unit 22 and then divided by the load current value (50 A).

The point A on the single-dot line in FIG. 2 indicates that the second battery unit 22 has the initial internal resistance value of 3.68 mΩ when the second battery unit 22 is just about to discharge form the saturation level. The point B indicates that the internal resistance value of the second battery unit 22 after discharging for 25 minutes increases to 1.24 times the original value. The segment of single-dot line after the point C indicated that the internal resistance will increase dramatically when the second battery unit 22 comes to an end of the discharging cycle. The point D indicates that the internal resistance value of the second battery unit 22 increases to 4 times the internal resistance value indicated by the point A. At this point of time, the rate of heat generation inside the second battery unit 22 will be 4 times the rate of the other battery unit according to the Joule's Law ($Q=I^2 \times R \times t$). Although the second battery unit 22 still has some remaining energy at this moment, the internal temperature will rise with a dramatic rate if the second battery unit 22 continues to discharge. According to the phenomenon, it can be predicted that the second battery unit 22 may cause a fire and serious safety problems. Therefore, when the internal resistance of the second battery unit 22 increases to a value greater than what indicated by point C, it has to be considered to stop using the second battery unit 22 and recharge it.

The double-dot chain line in FIG. 2 represents the variation of the quality reference value of the second battery unit 22.

More specifically, the quality reference value is calculated by dividing the internal resistance of the second battery unit 22, which varies with the discharging time, by the initial internal resistance value. Accordingly, the double-dot chain line is obtained by dividing the internal resistances represented in the single-dot chain line by the initial internal resistance. Therefore, the quality reference value should have an initial value of 1 when the second battery unit 22 is just about to discharge for the first time. By inspecting FIG. 2, it can be observed that the internal resistance of the second battery unit 22 comes to a value indicated by point C and starts to increase rapidly after a discharging time of 42 minutes. Meanwhile, the quality reference value goes about 2. Therefore, with the use of quality reference value, it would be very convenient to swiftly determine whether it is appropriate or not for the second battery unit 22 to continue the operation.

After the discharging data of the second battery unit 22 on the first discharging time is acquired, it can be utilized in the proceeding operation process to determine the operating state of the second battery unit 22. For example, when the second battery unit 22 is fully recharged again, the battery module 2 can then be used to start the power supply to the load 3. During the power supply process of the battery module 2 to the load 3, by using the battery module state detection device 1 to measure the instant internal resistance value of the second battery unit 22 in real time and comparing the measured instant internal resistance value to the relationship between internal resistance and discharging time which is obtained in advance, the current remaining energy value of the second battery unit 22 can be determined.

For another example, when the second battery unit 22 is about to run out of energy, fully recharge the second battery unit 22 again. Next, measure the instant internal resistance value of the second battery unit 22 at the instance when the battery module 2 is connected to the load 3 and starts the power supply. Finally, by comparing the measured instant internal resistance value to the relationship between internal resistance and discharging time, the ratio of the available energy after the second battery unit being recharged this time to that right after it being manufactured in factory can be determined. If the instant internal resistance value of the second battery unit 22, which is just fully recharged and about to discharge, is measured with a value about 2 times the initial internal resistance value, it is indicated that the second battery unit 22 is no longer appropriate for use and has to be discarded.

With the configuration and method mentioned hereinabove, the battery module state detection device 1 can measure the internal resistance values of the battery units of the battery module 2 and compare them with the respective relationship between internal resistance and discharging time. If any battery unit of the battery module 2 functions abnormally, then it will be very easy to find out where the problem is. Furthermore, the battery module state detection device can comprises a protection mechanism to further increase the safety of the operation of the battery module 2.

For example, the battery module state detection device 1 is able to monitor the quality reference values of all the battery units in the battery module 2. If any of the quality reference values is greater than a predetermined threshold value, then the battery module state detection device 1 can activate a protection mechanism to warn the user of the abnormal battery unit or to stop the power supply from the battery module 2 to the load 3.

Please refer to FIG. 3, which depicts a flow chart of the battery module state detection method according to one embodiment of the present invention. Since the method can be applied on the aforementioned battery module state detection device 1, the procedure of the method will be explained by taking the battery module state detection device 1 as an example. As illustrated in FIG. 3, the method of the present invention will be carried out in two stages. In the first stage, the relationship between internal resistance and discharging time of the second battery unit 22 is acquired, which will then be the future reference for the operating states of the second battery unit 22 when the battery module 2 supplies the power to the load 3. In the second stage, that is, when the battery module 2 supplies the power to the load 3, the current remaining energy value and lifetime can be determined according to the curve of the relationship between internal resistance and discharging time acquired previously. The steps of the method of the present invention will be described in detail as follow.

In the first stage, first recharge the second battery unit 22 to a saturation level (Step S51). Then, measure the no-load voltage value between the second positive electrode 221 and the second negative electrode 222 while the second battery unit 22 is not under operation (Step S52) so as to determine the curve of the no-load voltage value in the FIG. 2. Next, discharge the second battery unit 22 with the predetermined current value (Step S53). Furthermore, measure a plurality of successive discharging voltage values of the second battery unit 22 during the step of discharging the battery unit with the predetermined current value (Step S54) to obtain the curve of the on-load voltage value as that of in FIG. 2.

Then, obtain the relationship between internal resistance and discharging time of the second battery unit 22 by the calculation according to the no-load voltage value, the successive discharging voltage values and the predetermined current value (Step S55). More specifically, the step S55 is to subtract the no-load voltage value from the successive discharging voltage values and then divide the result of subtraction by the predetermined current value to obtain the corresponding successive internal resistance values. As illustrate in FIG. 2, the obtained successive internal resistance values can be plotted into the curve which presents the relationship between internal resistance and discharging time. In such a way, the current remaining energy value and the remaining lifetime of the battery unit can be determined according to the instant internal resistance value of the second battery unit 22 with reference to the relationship between internal resistance and discharging time.

In the second stage, first electrically connect the battery module 2 to the load 3 and supply the power to load 3 from battery module 2. Then, measure the on-load voltage value between the second positive electrode 221 and the second negative electrode 222 of the second battery unit 22 by the battery module state detection device 1 and measure the load current value of the load 3 by utilizing the shunt 12 (Step S61). Following up, calculate the instant internal resistance value of the second battery unit 22 according to the no-load voltage value and the on-load voltage value of the second battery unit 22 and the load current value of the load 3 (Step S62). Finally, obtain the operating state of the second battery unit 22 according the instant internal resistance value with reference to the relationship between internal resistance and discharging time (Step S63). More specifically, the operating state obtained in the step S63 is the remaining energy value of the second battery unit 22.

In practical application, the battery module state detection device 1 can determine the safe remaining energy value of the whole battery module 2 according to the remaining energy value of the second battery unit 22. Preferably, the battery module state detection device 1 is to first find out the battery unit which is with the lowest remaining energy value, and then determine the safe remaining energy value of the battery module 2 according to the lowest remaining energy value. This can effectively prevent any of the battery units being excessively discharged and the accompanying danger.

Furthermore, with the steps described hereinabove, the ratio of the remaining energy value of any battery unit after being fully recharged again to that of the battery unit being recharged for the first time after being manufactured can be determined so as to evaluate the remaining lifetime of the battery unit. Take the second battery unit 22 for an example, to this end, measuring the on-load voltage value in the step S61 is to measure the initial voltage value of the second battery unit 22 at the instant moment that the battery module 2 starts to supply power to the load 3. In addition, measuring the load current value of the load 3 is to measure the initial current value at the instant moment when the battery module 2 start to supply power to the load 3. Following, in the calculation of the step S62, the initial voltage value is substituted into the on-load voltage value while the initial current value is substituted into the load current value. Then, the instant internal resistance value obtained thereby is the recovered internal resistance value of the second battery unit 22 which is being recharged again. Finally, the step of S63 is carried out by comparing the recovered internal resistance value with the relationship between internal resistance and discharging time to obtain the remaining life of the second battery unit 22. More specifically, the step of S63 is to compare the recovered internal resistance value with the initial internal resistance value.

Please refer to FIG. 4, which illustrates the flow chart of the activation of the protection mechanism of the battery module state detection device 1. During the process of establishing the discharging data of the second battery unit 22 for the first discharging time by the battery module state detection device 1 (Step S55), a plurality of the internal resistance values of the second battery unit 22 corresponding to different discharging time can be calculated. Among the plurality of the internal resistance values, there should be an initial internal resistance value corresponding to the instant moment when the second battery unit 22 is just about to discharge. To carry out the protection mechanism, the battery module state detection device 1 will calculate the quality reference value according to the instant internal resistance and the initial internal resistance value during the proceeding operating process of the battery module 2 (Step S71). More specifically, the quality reference value is the instance internal resistance value of the second battery unit 22 divided by the initial internal resistance value.

Following, the battery module state detection device 1 will compare the quality reference value with the predetermined threshold value (Step S72). If the quality reference value is greater than the predetermined threshold value, the battery module state detection device 1 will activate the protection mechanism (Step S73). For example, the battery module state detection device 1 can warn the user of the abnormal operating state of the second battery unit 22 or shutdown the power supply provided by the battery module 2 to the load 3. It should be mentioned that although the second battery unit 22 is taken as an example to explain the protection mechanism, the method of the protection mechanism can be applied on all the battery units in the battery module 2.

In conclusion, the battery module state detection method of the present invention is carried out by measuring the on-load voltage value of each battery unit in the battery module and the load current value to obtain the variation of the internal resistance value of each of the battery units. By applying the battery module state detection method of the present invention, there is no need to apply the external alternating current to the battery unit. As a result, the present invention not only simplifies the circuit design, but also increases the safety of the measuring process and prevents the battery's lifetime being shortened by the damage during detection.

Furthermore, the method of the present invention can be used to predict the remaining energy value of each of the battery units during the current discharging cycle, as well as the remaining lifetime, according to the measured variation of the internal resistance value of each of the battery units. In such a way, the user is able to have the operating states of each of the battery units in hand so as to determine the timing for recharging or changing the battery units.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A battery module state detection method applied to a battery module state detection device (1) for a battery module,
   the battery module comprising one or more lithium iron phosphate battery unit of an initial internal resistance value and being connected to a load,
   the battery module state detection device (1) comprising:
   a detecting unit (11), comprising a plurality of test terminals connecting respectively a positive electrode and a negative electrode of the battery unit for measuring an on-load voltage value and a no-load voltage value of the battery unit,
   a shunt (12), and
   a control unit (10) for obtaining an internal resistance value of the battery,
   the battery module state detection method comprising the following steps of:
   (a) measuring an on-load voltage value of the battery unit and a load current value of the load;
   (b) calculating an instant internal resistance value of the battery unit by first subtracting the on-load voltage value from the no-load voltage value, and then dived by the load current;
   (c) obtaining an operating state of the battery unit according to the instant internal resistance value and a relationship between internal resistance and discharging time;
   (d) obtaining a numerical value of a quality reference by dividing the instant internal resistance value with the initial internal resistance value of the battery unit, with the numerical value of the quality reference value initialized to 1 when the battery unit is just about to discharge for the first time;
   (e) defining a safe remaining energy value of the battery module as the lowest of the numerical value of the quality reference obtained for the one or more battery unit; and
   activating a protection mechanism for the quality reference value exceeding a preset threshold value greater than 1.

2. The battery module state detection method of claim 1, wherein obtaining the operating state of the battery unit comprises obtaining a remaining energy value of the battery unit and determining a safe remaining energy value of the battery module according to the remaining energy value of the battery unit.

3. The battery module state detection method of claim 1, further comprising the step of: recharging the battery unit to a saturation level; measuring the no-load voltage value while the battery unit is not been operated; discharging the battery unit with a predetermined current value; measuring a plurality of successive discharging voltage values of the battery unit during the step of discharging the battery unit with the predetermined current value; and calculating a plurality of successive internal resistance values of the battery unit according to the no-load voltage value, the successive discharging voltage values and the predetermined current value to obtain the relationship between internal resistance and discharging time.

4. The battery module state detection method of claim 1, wherein the relationship between internal resistance and discharging time comprises an initial internal resistance value, the detection method further comprises the steps of: calculating a quality reference value according to the instant internal resistance value and the initial internal resistance value; comparing the quality reference value to a predetermined threshold value; and activating a protection mechanism if the quality reference value is greater than the predetermined threshold value to warn of an abnormal operating state of the battery unit or to stop the power supply of the battery module.

5. The battery module state detection method of claim 1, further comprising the step of: recharging the battery unit to a saturation level; wherein the step (a) is carried out by measuring an initial voltage value of the battery unit and an initial current value of the load, the step (b) is carried out by calculating a recovered internal resistance value, and the step (c) is carried out by obtaining a remaining lifetime of the battery unit according to the recovered internal resistance value and the relationship between internal resistance and discharging time.

* * * * *